US011056796B2

(12) United States Patent
Ruan et al.

(10) Patent No.: US 11,056,796 B2
(45) Date of Patent: Jul. 6, 2021

(54) DIRECTLY FLAT-ATTACHED SWITCHING COMPONENT FOR ACTIVE FREQUENCY SELECTIVE SURFACE AND FABRICATING METHOD THEREOF

(71) Applicant: National Chung-Shan Institute of Science and Technology, Taoyuan (TW)

(72) Inventors: Jian-Long Ruan, Taoyuan (TW); Shyh-Jer Huang, Taoyuan (TW); Yang-Kuo Kuo, Taoyuan (TW)

(73) Assignee: National Chung-Shan Institute of Science and Technology, Taoyuan (TW)

( * ) Notice: Subject to any disclaimer, the term of this patent is extended or adjusted under 35 U.S.C. 154(b) by 96 days.

(21) Appl. No.: 16/703,872

(22) Filed: Dec. 5, 2019

(65) Prior Publication Data

US 2021/0005974 A1 Jan. 7, 2021

(30) Foreign Application Priority Data

Jul. 4, 2019 (TW) ................................ 108123882

(51) Int. Cl.

*H01Q 15/00* (2006.01)
*H01Q 1/42* (2006.01)
*H01Q 23/00* (2006.01)
*H01L 51/42* (2006.01)

(52) U.S. Cl.

CPC .......... *H01Q 15/0066* (2013.01); *H01Q 1/42* (2013.01); *H01Q 23/00* (2013.01); *H01L 51/42* (2013.01)

(58) Field of Classification Search

CPC .......... H01L 21/00; H01L 51/42; H05K 1/00; H01Q 1/42; H01Q 15/0066; H01Q 23/00
See application file for complete search history.

(56) References Cited

U.S. PATENT DOCUMENTS

2012/0098628 A1* 4/2012 Batchelor .......... H01Q 15/0066 333/24 C

FOREIGN PATENT DOCUMENTS

| | | |
|---|---|---|
| JP | 9-205324 A | 8/1997 |
| JP | 2000-82916 A | 3/2000 |
| JP | 2011-119673 A | 6/2011 |
| JP | 2013-191824 A | 9/2013 |

* cited by examiner

*Primary Examiner* — Ermias T Woldegeorgis
(74) *Attorney, Agent, or Firm* — Winston Hsu

(57) ABSTRACT

The present invention provides a switching component of a directly flat-attached active frequency selective surface (AFSS) and fabricating method thereof. The present invention utilizes P-type and N-type thin film materials to fabricate a PN diode switching component capable of adjusting a resonance frequency of the AFSS, such that the AFSS together with the switching component could be integrally fabricated into a single thin film. Therefore, by utilizing a stepwise coating method to fabricate each layer with corresponding material, an equivalent length of a metal pattern could be adjusted, thereby changing the resonance frequency of the AFSS.

18 Claims, 5 Drawing Sheets

DIRECTLY FLAT-ATTACHED SWITCHING COMPONENT FOR ACTIVE FREQUENCY SELECTIVE SURFACE AND FABRICATING METHOD THEREOF

BACKGROUND OF THE INVENTION

1. Field of the Invention

The present invention relates to a switching component of an active frequency selective surface (AFSS) and fabricating method thereof, and more particularly, a switching component of a directly flat-attached AFSS and fabricating method thereof.

2. Description of the Prior Art

A frequency selective surface (FSS) is a spatial filter that has been developed since the 1960s. It is a two-dimensional periodic array of metal pattern units or metal foil opening (groove) units. FSS is usually flat and a few are curved. The characteristic impedance (or resonance frequency) of FSS is mainly affected by parameters such as geometry and size of the metal pattern units as well as refractive index and thickness of a substrate.

An active frequency selective surface (AFSS) involves disposing active switching components on the original FSS. These components usually need to be driven by methods such as external direct current (DC) voltage so that the original static FSS has two or more resonant characteristics (or characteristic impedances) and these states could be quickly switched via the DC voltage.

The prior art currently provides at least three approaches to realize AFSS components and the approaches are as follows: (1) Active components such as PIN diodes are added to a traditional FSS, and electrical bias is utilized to control resistance/capacitance of components to change an equivalent length or geometry of a metal pattern unit of the FSS, thereby changing the resonant characteristics. (2) The shape or arrangement of the FSS metal pattern units is directly changed by mechanical displacement or rotation to achieve goals of changing resonance characteristics thereof. (3) The dielectric constant or refractive index of the substrate is adjusted by means of organic semiconductor, liquid crystal molecules, ionic liquid, and so on, so as to change the resonance frequency of the FSS. The first approach has a better research basis.

In terms of an FSS, high electric field to free electron kinetic energy conversion rate means low transmittance since the electric field of the incident wave has been effectively converted into an induced current. If a length L of a basic dipole metal pattern of the FSS is set to be an electromagnetic wavelength λ, this kind of metal pattern with the length L causes the electromagnetic wave of a wavelength equal to 2λ to be significantly absorbed by free electrons in the metal pattern of the FSS (compared with other wavelengths). Therefore, the electromagnetic wave of the wavelength of 2λ could not penetrate the metal pattern of the FSS. This is how the basic dipole pattern of the FSS works.

In recent years, researchers have begun research and development of an active frequency selective surface. However, in order to achieve dynamic electronically controlled AFSS, semiconductor switching components are indispensable. Researchers currently apply commercially available PIN diodes and other components. Commercial radio frequency (RF) switching components are generally designed for circuits in high frequency transceiver systems such as switches in mobile phones or normal high frequency instruments. For the AFSS, these components are not ideal in terms of configuration or electrical properties, and could not meet flatness requirements because of the structural need of extra soldering commercial component(s). As shown in FIG. 1, which is a photograph of a high-frequency switching component connected to an AFSS circuit, it is necessary to solder a packaged PIN diode on the circuit substrate, and thus there is a significant protrusion.

Therefore, in order to solve the above problem, the applicant of the present invention developed a technique for integrally forming the AFSS together with the high-frequency switching component into a thin film in view of shortcomings of the prior art. The present invention brings more flexibility in application. For example, the thin film integrally made from the AFSS together with the high-frequency switching component is capable of being directly attached on the surface of a vehicle or radome, thereby reducing the difficulty of manufacturing.

SUMMARY OF THE INVENTION

In view of the aforementioned shortcomings of the prior art, the present invention utilizes P-type and N-type thin film materials to fabricate a PN diode switching component capable of adjusting a resonance frequency of an AFSS, such that the AFSS together with the switching component could be integrally fabricated into a single thin film. In addition, the FSS may be actively adjusted without extra soldered switching component(s).

A resonance frequency of an FSS is related to a length of a metal pattern. In the case of an FSS basic dipole metal pattern, the best way to change its resonant characteristics is to change the length of the metal pattern. There is a practical difficulty in manufacturing if the length of the pattern is to be directly stretched or compressed. An alternative is to bridge a "material (or component) capable of dynamically changing conductivity" between two segments of metal patterns (not necessarily with equal lengths). As the material (or component) becomes as conductive as metal, the two segments of metal patterns could be regarded as "one whole segment". As the conductivity of the material (or component) becomes smaller as that of an insulator, the two segments of metal patterns are regarded as two segments. By using the dynamic switching component, the present invention could adjust the equivalent length of the metal pattern, thereby actively changing the resonance frequency of the FSS to achieve the purpose of allowing or inhibiting an electromagnetic wave of a specific wavelength to pass through the FSS.

The present invention fabricates a switching component capable of adjusting a resonance frequency of the AFSS, and attaches a P-type and an N-type thin film diode to the AFSS circuit, such that the switching component and the AFSS circuit are integrated into one thin film, thereby solving the problem that the commercially available diode requires additional soldering which causes a significant protrusion on the structure. Please refer to FIG. 2, which is an actual photograph of a PN diode switching component connected with an AFSS circuit according to the embodiment of the present invention. The circuit substrate is plated with the PN diode as a switch. Compared with FIG. 1, since the PN diode switching component of the present invention is thinner and does not require additional soldering, the structure has no significant protrusion problems.

In order to achieve the above object, the present invention provides a fabricating method fora switching component of a directly flat-attached active frequency selective surface (AFSS). The fabricating method comprises (A) providing a dielectric substrate, and preparing a metal wire on the dielectric substrate; (B) fabricating an opening in the metal wire to expose the dielectric substrate; (C) preparing a high work function metal layer from a periphery of an end of the opening to a bottom of the end of the opening, wherein the dielectric substrate remains exposed at a bottom of another end of the opening; (D) preparing a P-type material layer on an upper surface of the high work function metal layer and a side of the high work function metal layer facing the another end of the opening, wherein the dielectric substrate still remains exposed at the bottom of the another end of the opening; (E) preparing an N-type material layer on an upper surface of the P-type material layer and a side of the P-type material layer facing the another end of the opening, wherein the dielectric substrate still remains exposed at the bottom of the another end of the opening; (F) preparing a low work function metal layer from an upper surface of the N-type material layer to a periphery of the another end of the opening, such that the low work function metal layer is across to the another end of the opening, and is mutually in contact with the N-type material layer, the dielectric substrate exposed at the bottom of the another end of the opening and the metal wire, to form a PN diode switching component of the AFSS.

In the above, the dielectric substrate is made of an electrically insulating material or a semiconductor material. The dielectric substrate is a silicon substrate or an FR4 glass fiber epoxy substrate.

In the above, the metal wire is a copper wire, an aluminum wire or a silver wire. The present invention further plates or engraves a high frequency circuit formed by the metal wire on the dielectric substrate.

In the above, the high work function metal layer is made of platinum (Pt), nickel (Ni), gold (Au), cobalt (Co) or Iridium (Ir). The P-type material layer is made of NiOx, SnOx, CuCrCaOx or $CuAlO_2$. The low work function metal layer is made of titanium (Ti), aluminum (Al), zinc (Zn), tin (Sn), manganese (Mn), iron (Fe), ruthenium (Ru), indium (In), copper (Cu), chromium (Cr), silver (Ag), or lead (Pb).

In the above, the high work function metal layer forms an ohmic contact with the P-type material layer; the low work function metal layer forms an ohmic contact with the N-type material layer.

In the above, a thickness of the high work function metal layer is 50 nm-100 nm, a thickness of the low work function metal layer 100 nm-200 nm, and a thickness of the P-type material layer or the N-type material layer is 50 nm-100 nm.

The present invention further provides a switching component for a directly flat-attached active frequency selective surface fabricated by the above fabricating method.

A flat-attached thin film diode switching component proposed by the present invention adopts a stepwise coating method to fabricate each layer with corresponding material, which is not a general planar stack coating method, so that a low work function metal layer in the upper portion of the component is not required to be additionally wired and connected to a high frequency circuit wire, thereby avoiding poor soldering and interface problems at the wire. In addition, the fabricating method of the present invention utilizes a PN thin film diode as a switching component of an AFSS circuit, and the PN thin film diode could be directly flat-attached to the surface of the AFSS circuit, which effectively solves the problems of soldering and structural protrusion in the prior art. Therefore, the present invention is more flexible in application, e.g. capable of being directly attached on the surface of the vehicle or radome, thereby reducing the difficulty of manufacturing.

In a flat-attached thin-film diode switching component fabricated by the present invention, an external bias is utilized to turn on a PN diode to conducts a path, and an open circuit is formed when there is no external bias. By utilizing the switching component, an equivalent length of a metal pattern is adjusted, thereby changing a resonance frequency of an active frequency selective surface, to achieve the purpose of allowing an electromagnetic wave with a specific wavelength to pass through the frequency selection surface or not. The flat-attached thin-film diode switching device proposed by the invention could be applied to an active frequency selective surface (AFSS) system and module with a frequency larger than 6 GHz.

These and other objectives of the present invention will no doubt become obvious to those of ordinary skill in the art after reading the following detailed description of the preferred embodiment that is illustrated in the various figures and drawings.

DETAILED DESCRIPTION

The embodiments of the present invention are described by way of specific examples, and those skilled in the art can readily understand the advantages and functions of the present invention from following description.

Figure 1:
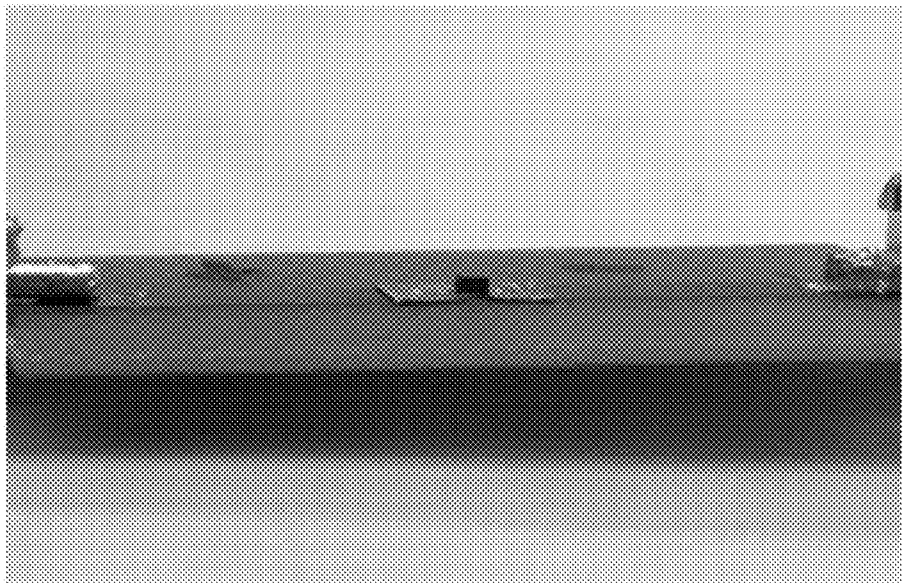
FIG. 1 PRIOR ART
FIG. 1 is an actual photograph of a high-frequency switching component connected to an active frequency selective surface (AFSS) circuit.
Figure 2:
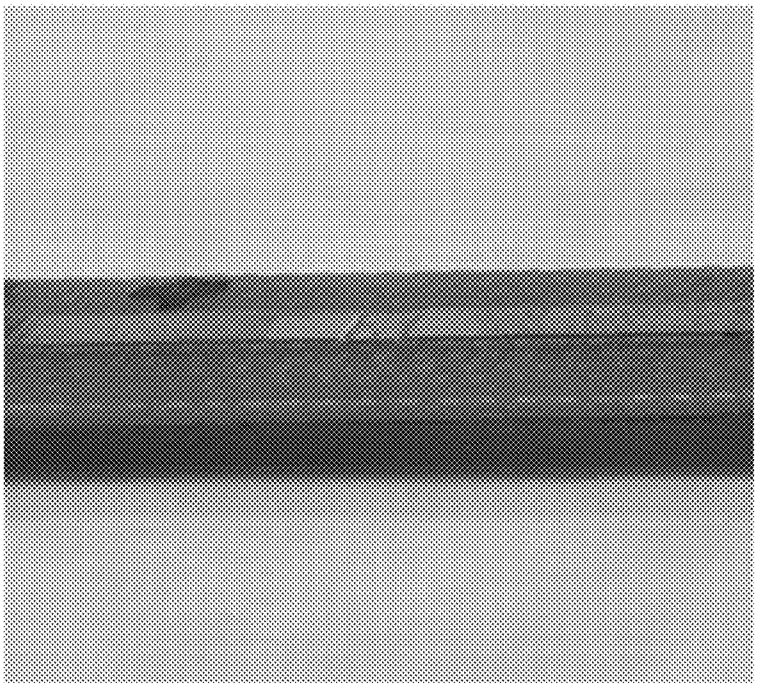
FIG. 2 is an actual photograph of a PN diode switching component connected with an AFSS circuit according to the embodiment of the present invention.
Figure 3:
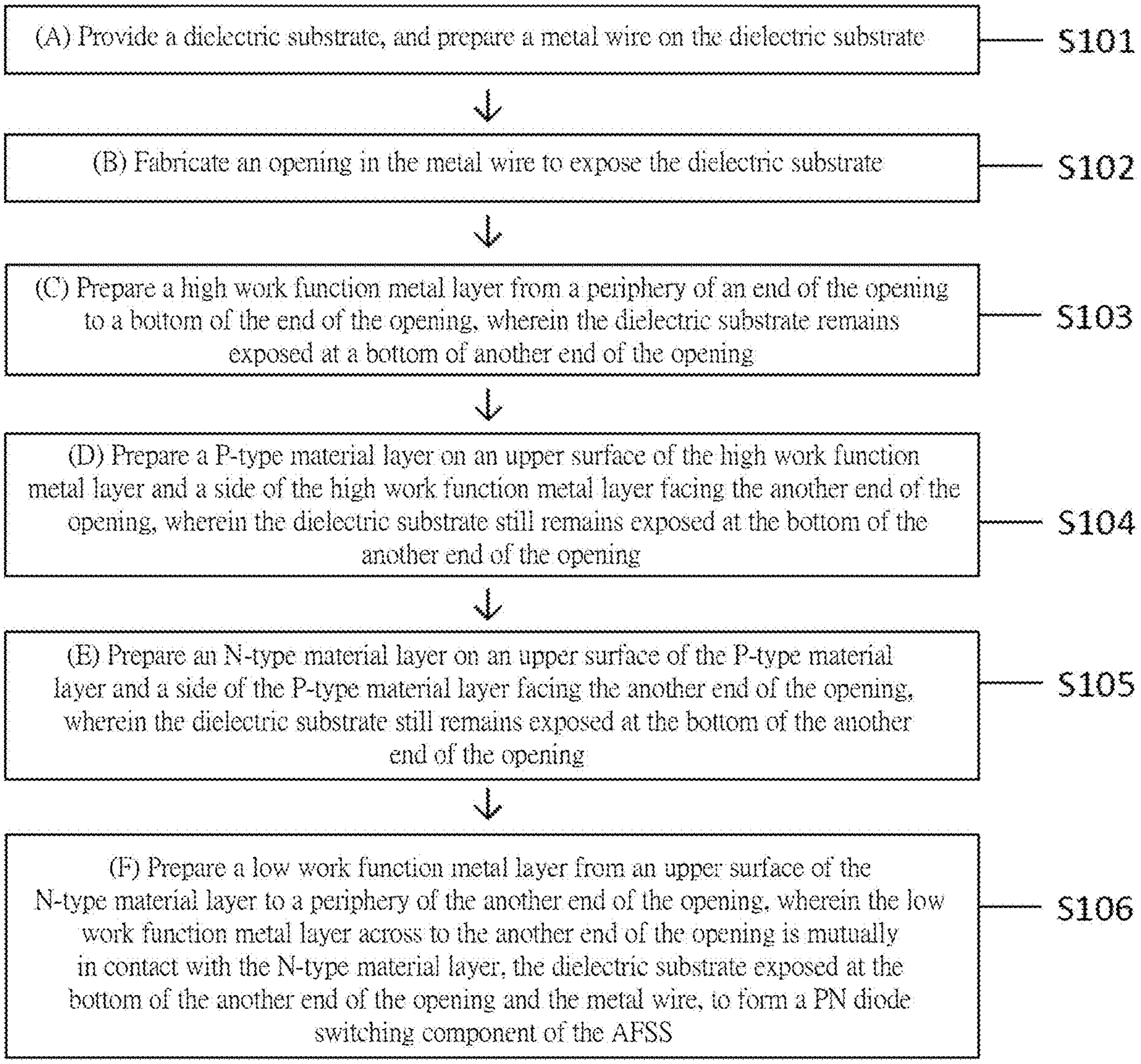
FIG. 3 is a flow chart of a fabricating process for a switching component of a directly flat-attached AFSS according to an embodiment of the present invention.

Please refer to FIG. 3, which is a flow chart of a fabricating process for a switching component of a directly flat-attached active frequency selective surface (AFSS) according to an embodiment of the present invention. As shown in FIG. 3, the fabricating process for the switching component of the directly flat-attached AFSS of the present invention comprises steps of:

Step S101: (A) Provide a dielectric substrate, and prepare a metal wire on the dielectric substrate.

Step S102: (B) Fabricate an opening in the metal wire to expose the dielectric substrate.

Step S103: (C) Prepare a high work function metal layer from a periphery of an end of the opening to a bottom of the end of the opening, wherein the dielectric substrate remains exposed at a bottom of another end of the opening.

Step S104: (D) Prepare a P-type material layer on an upper surface of the high work function metal layer and a side of the high work function metal layer facing the another end of the opening, wherein the dielectric substrate still remains exposed at the bottom of the another end of the opening.

Step S105: (E) Prepare an N-type material layer on an upper surface of the P-type material layer and a side of the P-type material layer facing the another end of the opening, wherein the dielectric substrate still remains exposed at the bottom of the another end of the opening.

Step S106: (F) Prepare a low work function metal layer from an upper surface of the N-type material layer to a periphery of the another end of the opening, wherein the low work function metal layer across to the another end of the opening is mutually in contact with the N-type material layer, the dielectric substrate exposed at the bottom of the another end of the opening and the metal wire, to form a PN diode switching component of the AFSS.

Figure 4:
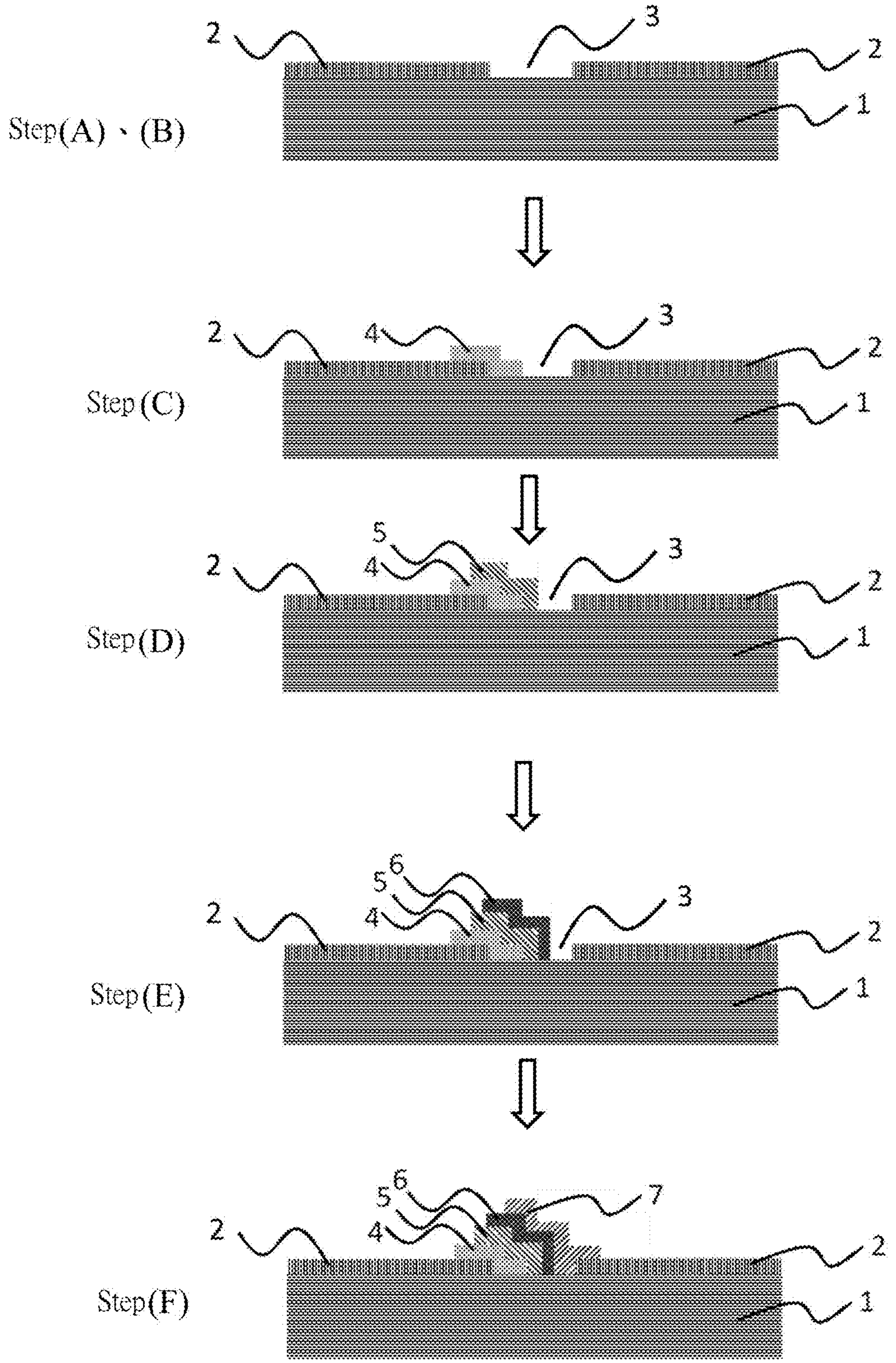
FIG. 4 is a schematic diagram of a fabricating process for a switching component of a directly flat-attached AFSS according to an embodiment of the present invention.

The present invention further provides a switching component for a directly flat-attached AFSS, and the switching component is prepared by the above fabricating method. Please refer to FIG. 4, which is a schematic diagram of a fabricating process for a switching component of a directly flat-attached AFSS according to an embodiment of the present invention. As shown in FIG. 4, a switching component of a directly flat-attached AFSS of the present invention comprises a dielectric substrate 1, a metal wire 2, an opening 3 of the metal wire 2, a high work function metal layer 4, a P-type material layer 5, an N-Type material layer 6, a low work function metal layer 7. The opening 3 is left in the middle of the metal wire 2 to install the switching component. The high work function metal layer 4 forms an ohmic contact with the P-type material layer 5, and the low work function metal layer 7 forms an ohmic contact with the N-type material layer 6.

EMBODIMENT

In this embodiment, first, a dielectric substrate is provided, and a copper wire is disposed on the dielectric substrate and an opening is reserved. Second, a high work function metal layer (i.e. a Pt layer) is sputtered from a periphery of one end of the opening to a bottom of the one end of the opening, and a thickness of the Pt layer is 70 nm, wherein the dielectric substrate remains exposed at a bottom of another end of the opening. Third, a P-type material layer (i.e. an NiO layer) with a thickness of 100 nm is sputtered on an upper surface of the Pt layer and a side of the Pt layer facing the another end of the opening (sputtering conditions: 100 W, $O_2$: 10 SCCM, working pressure: 3 mtorr), wherein the dielectric substrate still remains exposed at the bottom of the another end of the opening. Four, an N-type material layer (i.e. a ZnO layer) with a thickness of 100 nm is sputtered on an upper surface of the NiO layer and a side of the NiO layer facing the another end of the opening (sputtering conditions: 100 W, Ar: 7 SCCM, $O_2$: 3 SCCM, working pressure: 5 mtorr), wherein the dielectric substrate still remains exposed at the bottom of the another end of the opening; Five, a low work function metal layer (i.e. an Al layer) with a thickness of 200 nm is disposed from an upper surface of the ZnO layer to a periphery of the another end of the opening such that the low work function metal layer across to the another end of the opening is mutually in contact with the N-type material layer, the dielectric substrate exposed at the bottom of the another end of the opening and the metal wire, to form a PN diode switching component of the AFSS.

Figure 5:
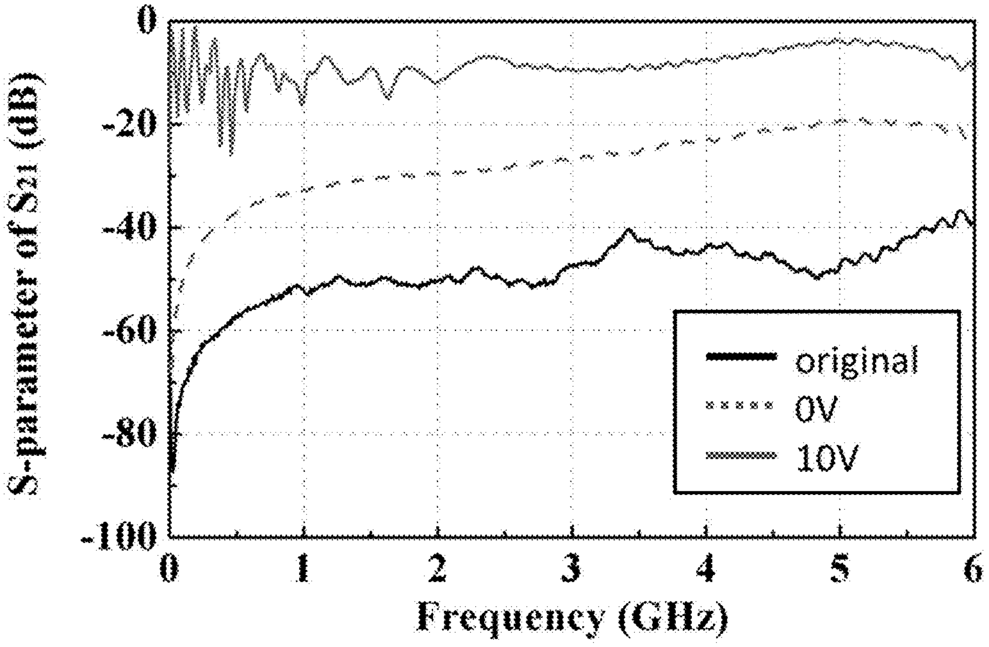
FIG. 5 is a measured result of a PN diode switching component when high frequency signals are inputted according to an embodiment of the present invention.

Please refer to FIG. 5, which is a measured result of a PN diode switching component when high frequency signals are inputted according to an embodiment of the present invention. Two terminal of the PN diode switching component are connected to a network analyzer, and responses of the high-frequency signals transmitted in the PN diode switching component are measured. As shown in FIG. 5, it could be clearly seen that when the diode is not turned on, i.e. when a bias voltage is 0V, the PN diode switching component is close to an open state, such that a transmission signal strength loss $S_{21}$ is close to an original condition in which the PN diode switching component is completely open (i.e. the diode is unattached, and there is a gap between two segments of circuits, which are not conducted at all). If the diode is turned on, i.e. when the bias voltage is 10V, the PN diode switching component is close to a short-circuit state, such that the transmission signal strength loss S21 is less and close to a state of 0 db in which the PN diode switching component is fully turned on. Therefore, as shown in FIG. 5, it is assured that the embodiment of the present invention has disposed a thin film diode component which could actively adjust a frequency selective surface without additional soldered switching components. The PN diode is turned on by an external bias to conduct a path, and an open circuit is formed when there is no external bias. By utilizing the switching component, an equivalent length of a metal pattern is adjusted, thereby changing a resonance frequency of an active frequency selective surface, to achieve the purpose of allowing an electromagnetic wave with a specific wavelength to pass through the frequency selection surface or not.

The present invention relates to a switching component of a directly flat-attached AFSS and fabricating method thereof, which utilizes a stepwise coating method to fabricate each layer with corresponding material, and utilizes P-type and N-type thin film materials to fabricate a PN diode switching component capable of adjusting a resonance frequency of the AFSS. Therefore, the AFSS together with the switching component could be integrally fabricated into a single thin film, and an equivalent length of a metal pattern could be adjusted, which facilitates subsequent processing and design. The switching element of the directly flat-attached active frequency selective surface of the present invention does not require a low work function metal layer in the upper portion of the component to be additionally wired and connected to a high frequency circuit wire, and could be applied to an AFSS system and module with a frequency larger than 6 GHz, and thus could be more widely applied in the future.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method for a switching component of a directly flat-attached active frequency selective surface (AFSS), the fabricating method comprising:

(A) providing a dielectric substrate, and preparing a metal wire on the dielectric substrate;

(B) fabricating an opening in the metal wire to expose the dielectric substrate;

(C) preparing a high work function metal layer from a periphery of an end of the opening to a bottom of the end of the opening, wherein the dielectric substrate remains exposed at a bottom of another end of the opening;

(D) preparing a P-type material layer on an upper surface of the high work function metal layer and a side of the high work function metal layer facing the another end of the opening, wherein the dielectric substrate still remains exposed at the bottom of the another end of the opening;

(E) preparing an N-type material layer on an upper surface of the P-type material layer and a side of the P-type material layer facing the another end of the opening, wherein the dielectric substrate still remains exposed at the bottom of the another end of the opening; and (F) preparing a low work function metal layer from an upper surface of the N-type material layer to a periphery of the another end of the opening, wherein the low work function metal layer across the another end of the opening is mutually in contact with the N-type material layer, the dielectric substrate exposed at the bottom of the another end of the opening and the metal wire to form a PN diode switching component of the AFSS.

2. The fabricating method of claim 1, wherein the dielectric substrate is made of an electrically insulating material or a semiconductor material.

3. The fabricating method of claim 1, wherein the dielectric substrate is a silicon substrate or an FR4 glass fiber epoxy substrate.

4. The fabricating method of claim 1, wherein the metal wire is a copper wire, an aluminum wire or a silver wire.

5. The fabricating method of claim 1, wherein the high work function metal layer is made of platinum (Pt), nickel (Ni), gold (Au), cobalt (Co) or Iridium (Ir).

6. The fabricating method of claim 1, wherein the P-type material layer is made of NiOx, SnOx, CuCrCaOx or $CuAlO_2$.

7. The fabricating method of claim 1, wherein the N-type material layer is made of doped ZnO or undoped ZnO.

8. The fabricating method of claim 1, wherein the low work function metal layer is made of titanium (Ti), aluminum (Al), zinc (Zn), tin (Sn), manganese (Mn), iron (Fe), ruthenium (Ru), indium (In), copper (Cu), chromium (Cr), silver (Ag) or lead (Pb).

9. The fabricating method of claim 1, wherein a thickness of the high work function metal layer is 50 nm-100 nm, a thickness of the low work function metal layer 100 nm-200 nm, and a thickness of the P-type material layer or the N-type material layer is 50 nm-100 nm.

10. A switching component for a directly flat-attached active frequency selective surface (AFSS), wherein a fabricating method for the switching component comprising:

(A) providing a dielectric substrate, and preparing a metal wire on the dielectric substrate;

(B) fabricating an opening in the metal wire to expose the dielectric substrate;

(C) preparing a high work function metal layer from a periphery of an end of the opening to a bottom of the end of the opening, wherein the dielectric substrate remains exposed at a bottom of another end of the opening;

(D) preparing a P-type material layer on an upper surface of the high work function metal layer and a side of the high work function metal layer facing the another end of the opening, wherein the dielectric substrate still remains exposed at the bottom of the another end of the opening;

(E) preparing an N-type material layer on an upper surface of the P-type material layer and a side of the P-type material layer facing the another end of the opening, wherein the dielectric substrate still remains exposed at the bottom of the another end of the opening; and (F) preparing a low work function metal layer from an upper surface of the N-type material layer to a periphery of the another end of the opening, wherein the low work function metal layer across the another end of the opening is mutually in contact with the N-type material layer, the dielectric substrate exposed at the bottom of the another end of the opening and the metal wire to form a PN diode switching component of the AFSS.

11. The switching component of claim 10, wherein the dielectric substrate is made of an electrically insulating material or a semiconductor material.

12. The switching component of claim 10, wherein the dielectric substrate is a silicon substrate or an FR4 glass fiber epoxy substrate.

13. The switching component of claim 10, wherein the metal wire is a copper wire, an aluminum wire or a silver wire.

14. The switching component of claim 10, wherein the high work function metal layer is made of platinum (Pt), nickel (Ni),gold (Au), cobalt (Co) or Iridium (Ir).

15. The switching component of claim 10, wherein the P-type material layer is made of NiOx, SnOx, CuCrCaOx or $CuAlO_2$.

16. The switching component of claim 10, wherein the N-type material layer is made of doped ZnO or undoped ZnO.

17. The switching component of claim 10, wherein the low work function metal layer is made of titanium (Ti), aluminum (Al), zinc (Zn), tin (Sn), manganese (Mn), iron (Fe), ruthenium (Ru), indium (In), copper (Cu), chromium (Cr), silver (Ag) or lead (Pb).

18. The switching component of claim 10, wherein a thickness of the high work function metal layer is 50 nm-100 nm, a thickness of the low work function metal layer 100 nm-200 nm, and a thickness of the P-type material layer or the N-type material layer is 50 nm-100 nm.

* * * * *